United States Patent [19]
Kesel

[11] Patent Number: 5,550,326
[45] Date of Patent: Aug. 27, 1996

[54] HEAT DISSIPATOR FOR ELECTRONIC COMPONENTS

[75] Inventor: Bradley K. Kesel, Newton, Mass.

[73] Assignee: Parker-Hannifin Corporation, Cleveland, Ohio

[21] Appl. No.: 274,599

[22] Filed: Jul. 13, 1994

[51] Int. Cl.$^6$ .................................................. H05K 7/20
[52] U.S. Cl. ...................... 174/16.3; 165/185; 174/252; 361/707; 361/712; 361/713
[58] Field of Search ................. 174/16.3, 252, 174/117 A; 361/705, 712, 713, 707, 708; 165/80.2, 80.3, 185

[56] References Cited

U.S. PATENT DOCUMENTS

| | | | |
|---|---|---|---|
| 2,106,133 | 1/1938 | Goldman | 174/117 A |
| 2,808,352 | 10/1957 | Coleman et al. | 174/117 A |
| 2,852,423 | 9/1958 | Bassett, Jr. | 174/117 A |
| 2,916,398 | 12/1959 | Marvin | 174/117 A |
| 3,497,383 | 2/1970 | Olyphant, Jr. et al. | 174/117 A |
| 4,474,879 | 3/1986 | DeGree et al. | 165/185 |
| 4,596,897 | 6/1986 | Gruhn | 174/36 |
| 4,755,249 | 7/1988 | Degree et al. | 156/252 |
| 4,788,627 | 11/1988 | Ehlert et al. | 361/386 |
| 4,794,981 | 1/1989 | Mizuno | 165/80.4 |
| 4,796,157 | 1/1989 | Ostrem | 361/386 |
| 5,049,981 | 9/1991 | Dahringer | 165/80.2 |
| 5,107,330 | 4/1992 | Dahringer | 165/80.2 |
| 5,173,839 | 12/1992 | Metz, Jr. | 361/387 |
| 5,315,480 | 5/1994 | Samarov et al. | 174/252 |

FOREIGN PATENT DOCUMENTS

| | | | |
|---|---|---|---|
| 2541498 | 8/1984 | France | 174/117 A |
| 4-179298 | 6/1992 | Japan | 174/16.3 |
| 121748 | 12/1970 | United Kingdom | 174/16.3 |

OTHER PUBLICATIONS

An Effective Alternative for Marginal Thermal Improvements of Semiconductor Devices; Bernie Siegal, Mark Berg; Tenth IEEE Semi–Therm Synposium ©1994.

*Primary Examiner*—Morris H. Nimmo
*Attorney, Agent, or Firm*—John A. Molnar, Esq.

[57] ABSTRACT

A low profile heat dissipator for low power IC packages which is formed of a metal, thermally conductive layer, zero, one or two electrically insulative layers positioned on one or both major surfaces of the metal layer, and an adhesive pad which bonds the dissipator to the surface of the electronic component. The dissipator may have a series of score lines formed in its surfaces which allows portions of the dissipator to be bent or removed so as to conform to the available space.

19 Claims, 2 Drawing Sheets

HEAT DISSIPATOR FOR ELECTRONIC COMPONENTS

FIELD OF THE INVENTION

This invention relates to a heat dissipator for electronic components. More preferably, it relates to a heat dissipator which is easily attached to and conforms to the surface of, an electronic component. The heat dissipator is also easily removable for repair or replacement of the component.

BACKGROUND OF THE INVENTION

Digital electronic systems, such as personal and business computers are vulnerable to premature partial or total failure caused by the overheating of one or more of its IC components (e.g. microprocessors, video chips, memory, etc.). Due to IC packaging materials and methods, and the heat dissipating capacity of its environment, these components do not have the ability to dissipate heat fast enough to perform normally. As a consequence of operating at temperatures over the manufacturer's specification, IC components can create digital errors and even fail completely.

To assist in dissipating the heat, cast or extruded metal heat sinks, such as are used in personal and larger computers and other electronic devices, have been mounted to the heat generating component. These heat sinks are heavy (1 to 5 ounces), large (up to 2 inches in height), expensive (typically $0.75 to $1.50 each with attachment method), sometimes difficult or impossible to remove for component repair/replacement, and may not conform well to the non-flat surface of the hot component, reducing heat dissipating efficiency and sometimes reliability of mechanical attachment. Reliability of mechanical attachment can also be affected by whether the package surface contains silicone or other substances which prevent good adhesion when using attachment methods other than clips. While these heat sinks remove heat from the component, many applications cannot use them for weight, cost, space, removeability, thermal and mechanical attachment and performance considerations.

It has been suggested that one use 1 oz copper foil as a heat bridge or path between an electrical component and a remotely located heat sink. This allows for one to locate a heat sink some distance, typically 1 to 2 inches, away from the heat source. Its ability to remove heat from the surface of the component is marginally better [than nothing], but it still requires the use of a separate, remotely located heat sink with its aforementioned disadvantages. Moreover, as it is electrically conductive, there are concerns that it could cause an electrical short circuit in either the component to which it is attached or to an adjacent component.

What is required is a heat dissipator which is low profile, inexpensive, easy to handle/attach/remove, electrically insulated and conforms to the surface profiles of electronic components.

SUMMARY OF THE INVENTION

The present invention relates to a heat dissipator comprising a laminate formed of:

a.) a thermal dissipation layer formed of a metal sheet which is from about 1 mil to 30 mils in thickness; and b.) optionally zero, one or two electrically insulative layers bonded to a major surface(s) of the thermal dissipation layer;

c.) an adhesive pad located on at least one surface of the insulated or uninsulated thermal dissipation layer.

The invention further relates to a heat dissipator comprising:

a.) a thermal dissipation layer formed of a metal sheet which is from about 1 mil to about 30 mils in thickness; and b.) a first electrically insulative layer bonded to a first major surface of the thermal dissipating layer;

c.) a second electrically insulative layer bonded to a second major surface of the thermal dissipating layer opposite the first major surface; and d.) an adhesive pad located on a portion of the first and/or second insulative layer, or the thermal dissipative layer.

The present invention provides a lightweight, low profile, inexpensive conformable heat dissipator for use in low power (under 6 watts) electronic applications. It is formed of a metal sheet heat dissipating layer, an electrically insulative layer positioned on the surface of the metal layer so as to be adjacent the electronic component to which it is attached, and an adhesive portion on the electrically insulative layer for attaching the dissipator to the component. Preferably, both major surfaces of the metal heat dissipating layer are covered by an electrically insulative layer. Moreover, it is preferred that a series of score lines be formed in the dissipator so as to allow for the bending of or removal of a portion of the dissipator in order to fit it in to the available space.

IN THE DRAWINGS

DESCRIPTION OF THE INVENTION

Figure 1:
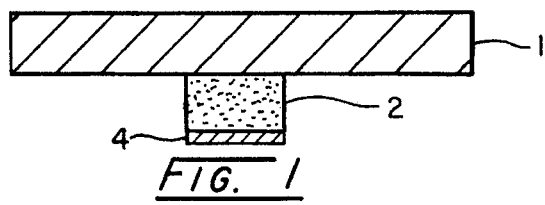
FIG. 1 shows a cross-sectional view of a first preferred embodiment.

FIG. 1 shows a first embodiment of the present invention with a thermal dissipation layer 1 and an adhesive attachment portion 2 for attaching the heat dissipator to the electronic component 4. This first embodiment covers applications that are not sensitive to electrical short circuits of immediate or surrounding components, and thus do not require an electrical insulation layer on either side of the dissipator.

Figure 2:
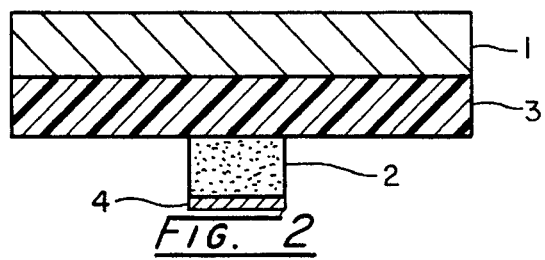
FIG. 2 shows a cross-sectional view of a second preferred embodiment.

FIG. 2 shows a second embodiment of the present invention with a thermal dissipation layer 1, an electrically insulative layer 3 bonded to the thermal dissipation layer on the side of that layer 1 which would be adjacent the electrical component to be cooled, and an adhesive attachment portion 2 for attaching the heat dissipator to the electronic component. This is to be used in those applications where electrical insulation is desired or required.

Figure 3:
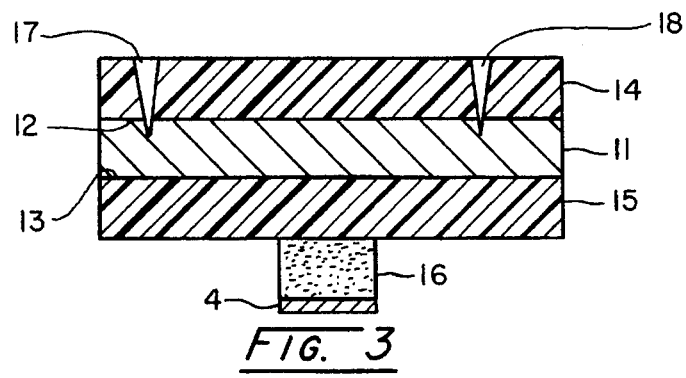
FIG. 3 shows a cross-sectional view of a third preferred embodiment.
Figure 4:
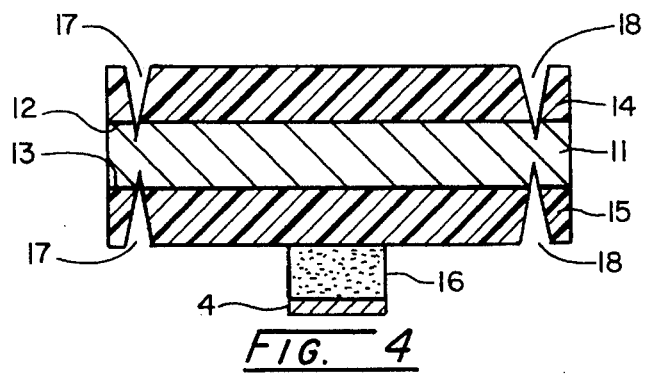
FIG. 4 shows a cross-sectional view of a fourth preferred embodiment.

FIG. 3 shows another embodiment of the present invention in which the thermal dissipating layer 11 has both of its major surfaces 12, 13 covered by a first and second electrically insulative layer 14 and 15 respectively. An adhesive portion 16 is mounted to the second electrically insulative layer 15 so as to attach the heat dissipator to the electronic component. Optionally, one or more score lines, (17 and 18) may be formed in at least one of the electrically insulative layers, preferably the first layer 14 and preferably partially in the thermal dissipation layer. These score lines allow one to bend a portion of the heat dissipator on an angle to the rest of the dissipator so as to allow for adequate clearance with adjacent electronic components. Further, the score lines, especially when formed in both surfaces of the heated dissipator opposite each other, such as is shown in FIG. 4, allows one to easily remove a portion of the dissipator, if needed, so as to conform its size to the available space.

The score lines should be formed partially into the metal dissipating layer. When an electrically insulative layer is superposed above or below the dissipating layer, as in FIG. 4, the score line should completely penetrate the electrically insulative layer and extend in to the dissipating layer.

Preferably, the score lines should not penetrate more than 70% of the thickness of the dissipating layer so that it does not detach during formation or application.

Figure 5:
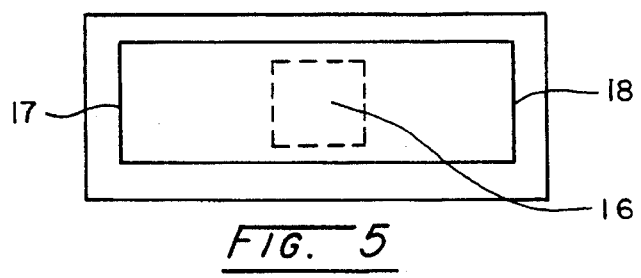
FIG. 5 shows a planar view of FIG. 3.

FIG. 5 shows a top planar view of the embodiment of FIG. 3. The score lines 17, 18 may be continuous around the perimeter of the dissipator so as to allow for bending or removal of all or some of the dissipation portion between the score line and the outer edge of the dissipator.

Figure 6:
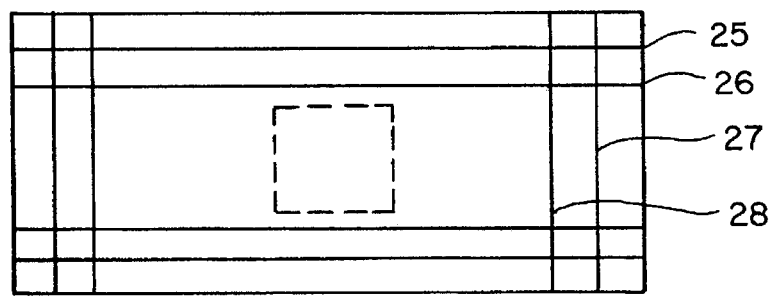
FIG. 6 shows a planar view of another preferred embodiment.

FIG. 6 shows a different embodiment wherein two series of score lines 25, 26, 27 and 28 are formed so as to allow for the bending or removal of incremental portions of the dissipator. Also, as shown in FIG. 6, if desired, the score lines may extend from one edge of the dissipator to the other opposite edge for ease in bending and removal. Also, while shown as being parallel to the edges of the dissipator, the score lines do not need to be so arranged if desired. For example, they can be arranged at a 45° angle to the boundary of two adjacent edges. Moreover, they need not be uniformly spread across the dissipator for example, one could set them all to one end or edge, or both ends or edges if desired.

Figure 7:
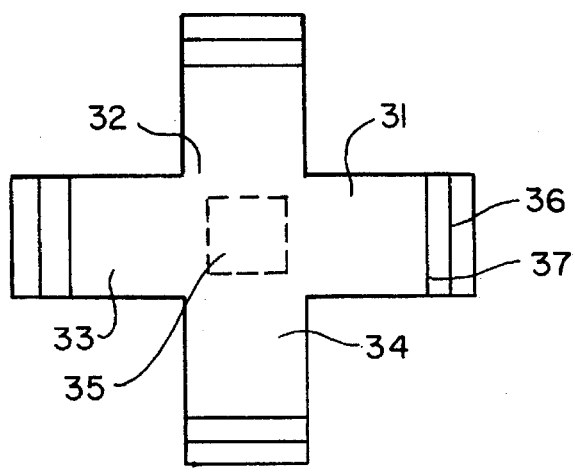
FIG. 7 shows a planar view of another preferred embodiment.

The shape of the dissipator does not need to be rectangular as shown in FIGS. 5 and 6. It could be cross like as shown in FIG. 7 where each of the four arms 31–34 contain a series of score lines 36, 37 (identified only on arm 31 for ease of viewing). The adhesive pad 35 would be located at the central portion of the dissipator.

Figure 8:
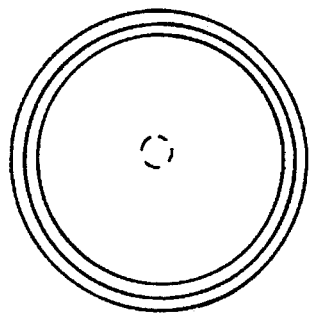
FIG. 8 shows a planar view of another preferred embodiment.

Alternatively, it may be circular, as shown in FIG. 8 and contain a series of circular score lines 41, 42. Optionally, the lines may be linear or a combination of linear and circular lines.

The adhesive portion (e.g. 2 of FIG. 1) should conform to the size of electronic component to which it is attached. Preferably, it is about the same dimensions in width and length as the component. However, if desired, it may be smaller than the size of the component so long as it adequately bonds the dissipator to the component and allows for adequate transfer of heat from the component to the dissipator. While shown as rectangular in FIGS. 1–7, it may be circular as shown in FIG. 8 or any other shape that is desired so long as it secures the dissipator to the component. Preferably, it is continuous so as to provide the maximum thermal dissipation pathway available. It may, however, be discontinuous if needed.

Preferably, the dissipator is essentially flat (tape-like) so as to have a low height profile which is particularly desirable in portable computers, computer subsystems (e.g. hard drives, PCMCIA cards) or between rack-mounted printed circuit boards, where conventional heat sinks take up too much space. Its overall thickness should be from about 1 mil to 30 mils.

Moreover, the dissipator should be light weight, ranging from about 0.005 oz/sq. inch1 (for 1 mil copper foil) to 0.15 oz/sq. inch (for 30 rail copper foil).

The dissipator should have sufficient thermal conductivity and dissipation characteristics so that it will reduce the IC package case temperature by from about 3C. to about 20C., even in areas of restricted convection. By restricted convection, it is meant that air flow is constrained or restricted to the point where it cannot effectively carry the heat energy away from the heat source. This case is evident in systems where air flow does not reach the hot component, either because there is no fan or ventilation openings, or because the hot component is blocked by other boards or components, or because the hot component is physically too far from moving air inside the system.

The size of the dissipator is not critical except that it be sufficiently large so as to provide adequate dissipation. Sizes depend upon the shape and size of the component as well as the dissipator. Typically, the size will cover an area of from 0.5 sq. inch to about 6 square inches. When in the preferred rectangular shape, the dissipators will vary in size from about 0.5 by 1 inch to 1.5 by 4 inches. Of course the greater the area of thermal dissipator, the greater the ability of the dissipator to eliminate unwanted heat.

The thermal dissipation layer is a metal layer, preferably formed of copper, aluminum, steel and various alloys of the above metals. Preferably, the layer is formed of a metal sheet which is sufficiently thick so as to be self-supporting and resistant to bending or distortion caused by accidental bumping during assembly. Moreover, it should be sufficiently thick so as to provide the necessary mass for good thermal dissipation. Preferably, it is formed of a metal sheet which is from about 1 mil to 30 mils thick. The actual thickness value is determined by the metal selected (e.g. copper has been found to be more thermally conductive than aluminum, so a light gauge copper may be used to obtain the same thermal properties as a heavier gauge aluminum); the desired size of the dissipator; the desired thermal dissipation characteristics and the weight allocated for the dissipator.

Preferably, one uses a 1.4 mil to 7 mil copper sheet or a 2 mil to 15 mil aluminum sheet to obtain the desired characteristics.

The electrically insulative layer or layers can be formed of any electrically insulative material. Preferably, it is formed of a plastic, due to its light weight, good insulative properties and ease of application to the metal. It may be in the form of a film or coating, with a film being preferred. Plastics which are suitable include but are not limited to polyimides, polyolefins such as polyethylene or polypropylene; polyolefin copolymers such as EPPM or ethylene vinyl acetate copolymers; fluorinated polymers, such as TEDLAR® a polyvinyl fluorinated film; nylons, epoxies and urethanes. Silicone rubbers are less preferred due to their ability to migrate and contaminate electrical contacts. However, with proper handling and/or the use of encapsulants, silicones can be used.

The insulative layer should be relatively thin so as to not interfere with the transfer and dissipation of heat from the component to the ambient air. Optionally, the layer may contain thermally conductive fillers, such as alumina or boron nitride to enhance its thermal conductivity characteristics. Also optionally it may contain a black or other dark colored pigment.

The preferred material is black TEDLAR® film, (a polyvinyl fluorinated material) which is laminated to the metal layer. It may be bonded by a heat bond or by an adhesive, such as an acrylic or epoxy.

Alternatively, the layer can be applied as a coating, for example, as a spray applied or coil coated epoxy or acrylic or as a hot melt polyethylene.

In all instances, such a layer is typically from about 0.001 inch to 0.100 inch in thickness.

The adhesive attachment portion may be a pressure sensitive adhesive, such as an acrylic, urethane or silicone.

Alternatively, it may be a curable adhesive, such as a heat curable epoxy or a catalytically curable epoxy or urethane.

If desired, the adhesive may contain a thermally conductive filler, such as alumina or boron nitride to enhance the thermal transfer from the component to the dissipator, and/or a flame retardent such as antimony to enhance the flammability resistance of the product.

EXAMPLE

Heat dissipators according to the present invention were formed of a 7 mils thick copper sheet laminated on both major surfaces with a 1 mil thick layer of black TEDLAR® film. The film was bonded to the copper sheet via an acrylic adhesive.

The dissipators were made in a variety of sizes as described in the Table. Each was mounted to an Intel 386 PQFP microprocessor supplied with an electrical source and driven with 3 Watts of power. The dissipators were applied to the chip using less than 5 lb. load and were tested within 30 minutes of application. Restricted air movement was simulated by placing a 1×5×6 inch Plexiglas box around the test fixture.

The results obtained are shown in Table I.

TABLE 1

| Dissipator Size | Air Flow over the PQFP component | Temperature of the PQFP case | Maximum Allowable Case Temperature | Cooling Effect of Dissipator* |
|---|---|---|---|---|
| None (no dissipator used) | restricted convection | 92C | 85C | — |
| 0.5" × 2.0" | restricted convection | 82 | | 10C |
| 1.0" × 3.0" | restricted convection | 79 | | 13 |
| 1.0" × 4.0" | restricted convection | 71 | | 21 |
| 1.5" × 4.0" | restricted convection | 68 | | 24 |

*Figures represent the temperature drop in PQFP case provided by the addition of a dissipator.

As can be appreciated from the data cited in Table I, one obtains a significant reduction in temperature at the component level with the use of the present dissipator, even under restricted or no air flow conditions.

What I claim is:

1. A heat dissipator for a heat-generating electronic component comprising:
    a thermal dissipation layer formed of a thermally conductive metal sheet which is from about 1 mil to 30 mils in thickness and which has a first surface and a second surface opposing the first surface; and
    an adhesive pad having an inner surface mounted to the first surface of the metal sheet and an outer surface bonded to a heat-generating electronic component.

2. The dissipator of claim 1 wherein the dissipator has an area of from about 0.5 square inch to about 6 square inches.

3. The dissipator of claim 1 further comprising an electrically insulative layer bonded to the second surface of the metal sheet.

4. The dissipator of claim 1 wherein the metal sheet is selected from the group consisting of copper, aluminum, steel and alloys thereof.

5. A heat dissipator for a heat-generating electronic component comprising a laminate formed of:
    a) a thermal dissipation layer formed of a thermally conductive metal sheet which is from about 1 mil to 30 mils in thickness and which has a first surface and a second surface opposing the first surface;
    b) a first electrically insulative layer bonded to the first surface of the thermal dissipation layer; and
    c) an adhesive pad having an inner surface mounted on said first electrically insulative layer and an outer surface bonded to a heat-generating electronic component.

6. The heat dissipator of claim 5 further comprising:
    d) a second electrically insulative layer bonded to the second surface of the thermal dissipation layer.

7. The heat dissipator of claim 5 wherein the metal sheet is selected from the group consisting of copper, aluminum, steel and alloys thereof.

8. The heat dissipator of claim 5 wherein the electrically insulative layer is selected from the group consisting of polyolefins, polyolefin copolymers, fluorinated polymers, nylons, epoxies, urethanes, polyimides and silicones.

9. A heat dissipator comprising:
    a) a thermal dissipation layer formed of a metal sheet which is from about 1 mil to about 30 mils in thickness; and
    b) a first electrically insulative layer bonded to a first major surface of the thermal dissipating layer;
    c) a second electrically insulative layer bonded to a second major surface of the thermal dissipating layer opposite the first major surface; and
    d) an adhesive pad located on a portion of the first insulative layer.

10. The dissipator of claim 9 further comprising a series of score lines through the first insulative layer and a portion not to exceed 70% of the thickness of the thermal dissipation layer.

11. The dissipator of claim 9 further comprising users of score lines extending through the second insulative layer and a portion not to exceed 70% of the thickness of the thermal dissipating layer.

12. The heat dissipator of claim 9 further comprising a series of score lines formed in the first and second electrically insulating layers and a portion of the thermal dissipating layer.

13. The dissipator of claim 12 wherein the score lines in the first and second electrically insulating layers are directly opposite each other.

14. The dissipator of claim 12 wherein the score lines formed in the thermal dissipating layer are formed of each of the major surfaces adjacent the first and second insulative layers and wherein the depth of the score lines in the thermal dissipating layer in the aggregate does not exceed 70% of the thickness of the thermal dissipating layer.

15. A method of dissipating heat from a heat-generating electrical component comprising the steps of:

a) providing a heat dissipator comprising a lamination of a thermal dissipation layer formed of a thermally conductive metal sheet which is from about 1 mil to 30 mils in thickness and which has a first surface and a second surface opposing the first surface, and an adhesive pad having an inner surface mounted to the first surface of the metal sheet and an outer surface; and b) bonding a heat-generating electrical component to the outer surface of the adhesive pad of said lamination.

16. The method of claim 15 wherein said heat dissipator is provided in step a) as further comprising an electrically insulative layer bonded to the second surface of the metal sheet.

17. A method of dissipating heat from a heat-generating electrical component comprising the steps of:

a) providing a heat dissipator comprising a lamination of:

a thermal dissipation layer formed of a thermally conductive metal sheet which is from about 1 mil to 30 mils in thickness and which has a first surface and a second surface opposing the first surface;

a first insulative layer bonded to the first surface of the thermal dissipation layer; and an adhesive pad having an inner surface mounted on the first insulative layer and an outer surface; and b) bonding a heat-generating electrical component to the outer surface of the adhesive pad of said lamination.

18. The method of claim 17 wherein said heat dissipator is provided in step a) as further comprising a second electrically insulative layer bonded to the second surface of the metal sheet.

19. A heat dissipator comprising a laminate formed of:

a) a thermal dissipation layer formed of a metal sheet which is from about 1 mil to 30 mils in thickness;

b) at least an electrically insulative layer bonded to a first major surface of the thermal dissipation layer;

c) an adhesive pad mounted to one surface of the laminate; and d) a second electrically insulative layer mounted to a second major surface of the thermal dissipation layer which is opposite the first major surface thereof to which the first electrically insulative layer is mounted.

* * * * *